United States Patent
Maejima

(10) Patent No.: US 7,671,673 B2
(45) Date of Patent: Mar. 2, 2010

(54) CLASS-D AMPLIFIER

(75) Inventor: Toshio Maejima, Iwata (JP)

(73) Assignee: Yamaha Corporation, Hamamatsu-shi (JP)

( * ) Notice: Subject to any disclaimer, the term of this patent is extended or adjusted under 35 U.S.C. 154(b) by 22 days.

(21) Appl. No.: 12/004,373

(22) Filed: Dec. 20, 2007

(65) Prior Publication Data

US 2008/0150635 A1      Jun. 26, 2008

(30) Foreign Application Priority Data

Dec. 26, 2006   (JP)   ............... 2006-350615

(51) Int. Cl.
    *H03F 3/38*   (2006.01)
(52) U.S. Cl. ........................ 330/10; 330/251
(58) Field of Classification Search ................ 330/10, 330/207 A, 251; 375/238
    See application file for complete search history.

(56) References Cited

U.S. PATENT DOCUMENTS 5,610,606 A    3/1997  Fukunaga et al.
6,414,614 B1*  7/2002  Melanson .................... 330/10
7,453,316 B2* 11/2008  Shimizu ...................... 330/10
2005/0200405 A1* 9/2005  Shinohara et al. ............. 330/10

FOREIGN PATENT DOCUMENTS

JP        7038440       2/1995
JP       10075177       3/1998
JP     2004128750       4/2004

* cited by examiner

*Primary Examiner*—Khanh V Nguyen
(74) *Attorney, Agent, or Firm*—Pillsbury Winthrop Shaw Pittman LLP

(57) ABSTRACT

A PWM modulator adds first and second input signals to each other, and performs PWM modulation processing for outputting a PWM-modulated pulse whose pulse width is modulated according to a result of addition. A shift register delays a bit stream acquired from a $\Delta\Sigma$ modulator, thereby generating two bit streams having a time difference which is one-half a period of PWM modulation processing, and the bit streams are supplied at first and second input signals to the PWM modulator.

2 Claims, 3 Drawing Sheets

CLASS-D AMPLIFIER

BACKGROUND OF THE INVENTION

The present invention relates to a class-D amplifier which generates a PWM-modulated pulse based on a bit stream of one bit acquired through ΔΣ modulation, to thus drive a load.

Such a class-D amplifier has been proposed which applies a ΔΣ-modulated bit stream of one bit to a PWM (Pulse Width Modulation) modulator as an input signal showing original sound and which drives a load, such as a speaker, by the PM-modulated pulse output from the PWM modulator (refer to; for example, JP-A-2004-128750), thereby reproducing an audio signal. The class-D amplifier of this type has a simplified circuit configuration and has an advantage of being easily embodied as an integrated circuit.

Incidentally, during ΔΣ modulation, quantization noise is shifted toward a high-frequency domain due to so-called noise shaping at the time of generation of a bit stream. Therefore, the bit stream acquired through ΔΣ modulation includes a large amount of quantization noise at high frequencies. Such quantization noise at high frequencies is lessened to a certain extent by integration processing performed in the PWM modulator after the bit stream has been input to the PWM modulator. However, the amount of attenuation is not sufficient. Therefore, the quantization noise insufficiently attenuated by PWM modulation processing of the PWM modulator induces aliasing noise, and a frequency band of the aliasing noise extends to an audio band occupied by spectra of original sound, thereby posing a problem of deterioration of quality of sound reproduced by the class-D amplifier. in order to avoid occurrence of such a problem, a filter for eliminating noise near a PWM modulation frequency from the bit stream must be provided in a preceding stage of the PWM modulator. However, such a filter is embodied as a large-scale filter, which raises a problem of a class-D amplifier becoming expensive.

SUMMARY OF THE INVENTION

The present invention has been conceived in view of the above-described circumstances and aims at providing a class-D amplifier capable of preventing occurrence of aliasing noise in an audio frequency band, which would otherwise be caused during PWM modulation of a bit stream, by a simple configuration as well as reproducing high-quality sound.

The present invention provides a class-D amplifier comprising:

A delay unit that receives and delays an input bit stream acquired through ΔΣ modulation, generates first and second bit streams; and A pulse width modulator that adds the first and second input signals, output from the delay unit, to each other, and performs a pulse width modulation processing for outputting a pulse width-modulated pulse whose pulse width is modulated according to the result of the addition, Wherein the first and second bit streams generated by the delay unit have a time difference near one-half of a period of the pulse width modulation processing.

Accordingly, when the first and second bit streams include noise near a PWM modulation frequency which is an inverse of the period of PWM modulation processing, noise acquired near the PWM modulation frequency included in the first bit stream becomes essentially opposite in phase to noise acquired near the PWM modulation frequency included in the second bit stream. The noises cancel each other out by addition. Accordingly, the PWM modulator generates a signal from which the noise near the PWM modulation frequency is eliminated, by addition of the first and second bit streams; and performs PWM modulation processing in accordance with the signal. Consequently, at the time of PWM modulation processing, occurrence of aliasing noise ranging the audio frequency band can be prevented, and high-quality sound can be reproduced.

DETAILED DESCRIPTION OF PREFERRED EMBODIMENTS

An embodiment of the present invention will be described hereunder with reference to the drawings.

Figure 1:
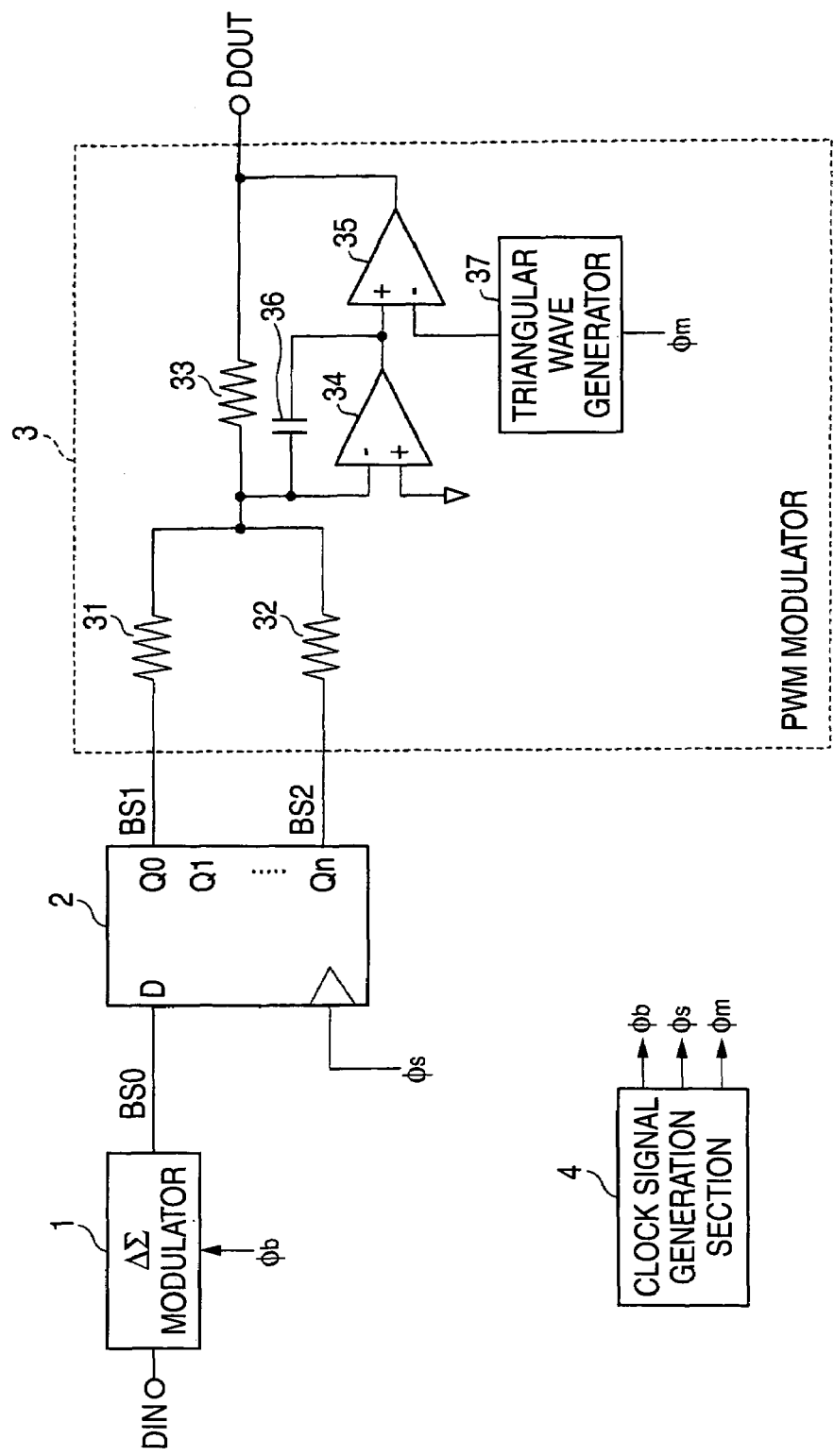
FIG. 1 is a circuit diagram showing the configuration of a class-D amplifier which is an embodiment of the present invention.

FIG. 1 is a circuit diagram showing the configuration of a class-D amplifier according to an embodiment of the present invention. The class-D amplifier includes a ΔΣ modulator 1; a shift register 2; a two-input PWM modulator (pulse width modulator) 3; and a lock signal generation section 4. The clock signal generation section 4 generates an original clock signal of predetermined frequency and subjects the original clock signal to frequency division, thereby generating a bit clock signal φb, a shift clock signal φs, and a modulated clock signal φm. The bit clock signal φb, the shift clock signal φs, and the PWM-modulated clock signal φm are synchronized to each other. The frequency of the shift clock signal φs is "n" ("n" is a predetermined integer) times the frequency of the bit clock signal φb and 2 k ("k" is a predetermined integer) times the frequency of the PWM-modulated clock signal φm. Specifically, the frequency of the shift clock signal φs is a common multiple of the frequency which is two times the frequency of the bit clock signal φb and the frequency of the PWM-modulated clock signal φm.

The ΔΣ modulator 1 is a circuit which generates a bit stream BS0 of the one bit by subjecting, to_modulation, a multibit digital audio signal DIN (e.g., PCM (Pulse Code Modulation) sample data] reproduced from a recording medium or received from another device and which outputs respective bits constituting the bit stream BSO in synchronism with the bit clock signal φb.

The shift register 2 is a circuit functioning as a delay unit for delaying the bit stream BSO, to thus generate bit streams BS1 and BS2. In more detail, the shift register 2 is a known shift register built from n+1 flip-flops, and shifts the bit stream BSO by the shift clock signal φs, to thus supply the PWM modulator 3 with the bit stream BS1 output from an output terminal QO of a flip-flop in the $0^{th}$ stage and the bit stream BS2 output from an output terminal Qn of the nth ("n" is a predetermined integer) flip-flop.

The PWM modulator 3 is a circuit which receives the bit streams BS1 and BS2 as input signals and adds the signals to each other, and which periodically repeats PWM modulation processing (pulse width modulation processing), in which a PWM-modulated pulse DOUT whose pulse width is modulated according to a result of addition is output, in synchronism with the PWM-modulated clock m of predetermined frequency.

In the embodiment shown in FIG. 1, the PWM modulator 3 includes input resistors 31 and 32 having the same resistance value; a feedback resistor 33, operational amplifiers 34 and 35; a capacitor 36; and a triangular wave generator 37. A reference voltage equivalent to one-half a source voltage of the class-D amplifier is applied to a positive-phase input terminal (+terminal) of the operational amplifier 34, and the capacitor 36 is interposed between an output terminal and an opposite-phase input terminal (−terminal) of the operational amplifier 34. The bit streams BS1 and BS2 are input to the opposite-phase input terminal of the operational amplifier 34 through the input resistors 31 and 32, and the PWM-modulated pulse DOUT is input to the same through the feedback resistor 33. The operational amplifier 34 and the capacitor 36 act as an error integrator which integrates an error between the sum of the bit streams BS1 and BS2 input through the input resistors 31 and 32 and the PWM-modulated pulse DOUT input through the feedback resistor 33. The triangular wave generator 37 outputs a triangular-wave signal synchronized to the PWM-modulated clock signal φm. The operational amplifier 35 functions as a comparator which compares a signal output from the error integrator including the operational amplifier 34 and the capacitor 36 with a triangular-wave signal output from the triangular wave generator 37, thereby outputting the PWM-modulated pulse DOUT.

In the present embodiment, a frequency ratio 2k between the shift clock signal φs and the PWM-modulated clock signal φm is determined in such a way that the length of the shift clock signal φs equivalent to an "n" periodic time comes to one-half (i.e., one-half the period of the PWM-modulated clock signal φm) of a period Tm of PWM modulation processing and such that the bit streams BS1 and BS2 having a time difference of TM/2 is output from the shift register 2.

The above is the detailed configuration of the present embodiment.

Operation of the present embodiment will now be described with reference to an exemplification. In example operation, the clock signal generation section 4 generates a bit clock signal φb having a frequency of 3072 kHz (=48×64 kHz), a shift clock signal φs having a frequency of 9216 kHz (=48×64×3 kHz=576×2×8 kHz), and a PWM-modulated clock signal φm having a frequency of 576 kHz (=48×12 kHz). The ΔΣ modulator 1 is applied with a multibit digital audio signal DIN having a sampling frequency of 48 kHz. The ΔΣ modulator 1 subjects the multibit digital audio signal DIN to 64-times oversampling and subjects noise shaping for shifting quantization noise to a high-frequency domain, thereby outputting the bit stream BSO of 48×64 kHz in synchronism with the bit clock signal φb. The number of states n+1 of the shift register 2 is nine, and the shift register 2 generates, from the bit stream BSO, the bit streams BS1 and BS2 having a time difference equivalent to eight periods of the shift clock signal.

The PWM modulation period Tm is 1/576 kHz, and the period of the shift clock signal φs is 1/9216 kHz=1/(576×2×8 kHz). Hence, the time difference between the bit stream BS! And the bit stream BS2, which is eight times the period of the shift clock signal φs, is the equivalent of one-half the PWM modulation period Tm. Accordingly, a signal component of the PWM modulation frequency Fm=1/m of the bit stream BS1 and the PWM modulation frequency Fm=1/Tm of the bit stream BS2 are in opposite phase. Thus, when the bit stream BS1 and the bit stream B2 are input to the error integrator of the PWM modulator 3 through the resistors 31 and 32 having the same resistance value, the bit streams BS1 and BS2 cancel each other out. Even in a range near the PWM modulation frequency Fm; for example a range of Fm±20 kHz, the signal components of the bit streams BS1 and BS2 are essentially in opposite phase and hence cancel each other out by addition. Consequently, the signals input to the error integrator of the PWM modulator 3 are greatly attenuated in the rate near the PWM modulation frequency Fm.

Figure 2:
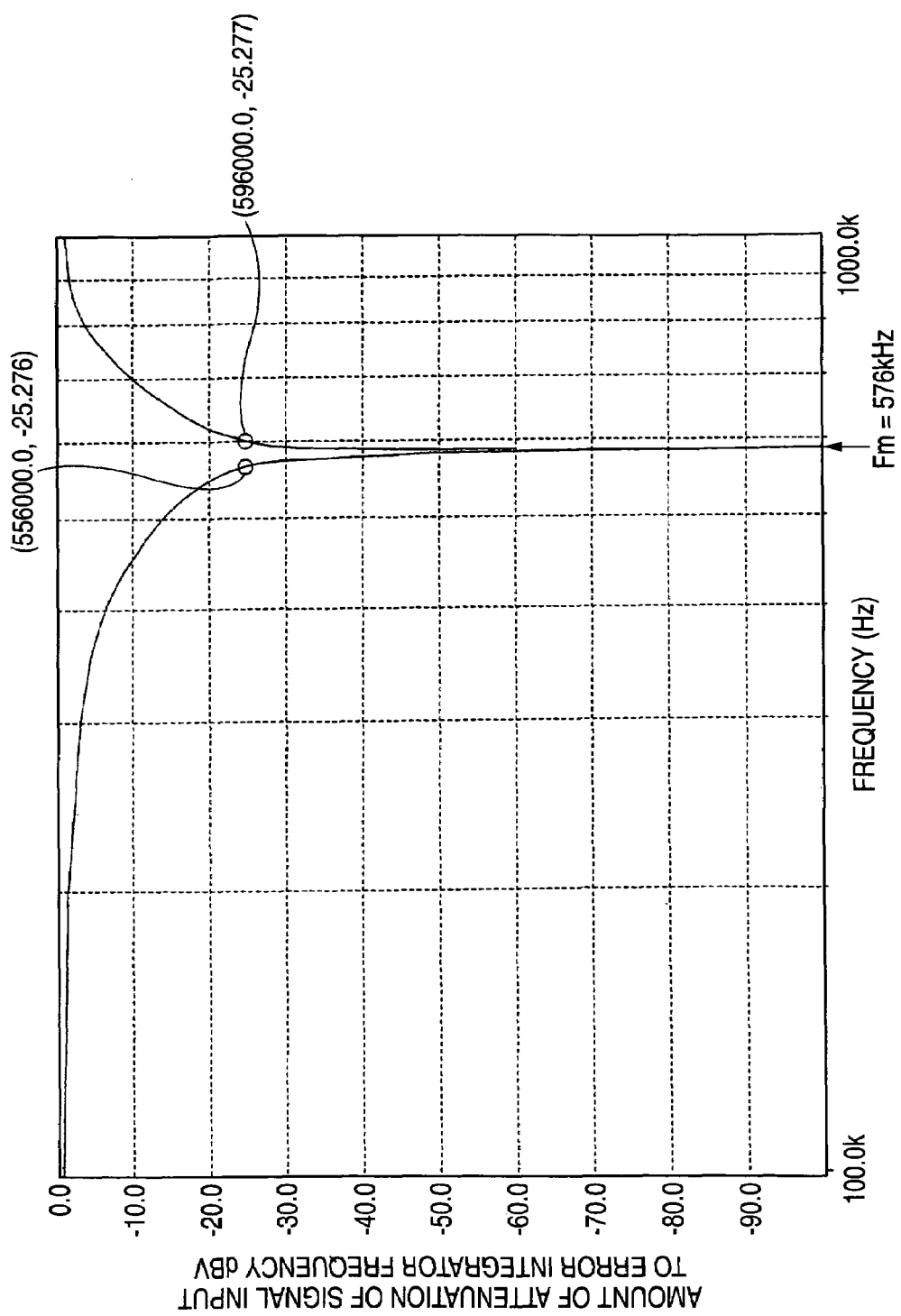
FIG. 2 is a view showing an attenuation characteristic of a signal input to an error integrator of a PWM modulator 3 of the class-D amplifier.

FIG. 2 is a view showing an attenuation characteristic of a signal input to the error integrator of the PWM modulator 3. The bit streams BS1 and BS2 input to the error integrator of the PWM modulator 3 include large amounts of quantization error at high frequencies. Of the quantization noise, noise falling within a range of 376 kHz±20 kHz is attenuated by 25 dB or more when a signal is input to the error integrator as shown in FIG. 2. Accordingly, aliasing noise of quantization noise developing in the PWM modulator 3 is sufficiently attenuated in the audio frequency band (0 to 20 kHz), whereby deterioration of sound quality of sound reproduced by the speaker that is a load of the PWM modulator 3.

A phase difference equivalent to the time difference Tm/2 [1/(576×2 kHz) in the exemplification] between the bit stream BS1 and the bit stream BS2 is considerably small in the audio range, and the bit streams BS1 and BS2 can be considered to be identical to each other. Consequently, even when the bit streams BS1 and BS2 having the time different Tm/2 are applied to the PWM modulator 3, reproduction quality achieved in the audio frequency band is not adversely affected.

As described above, according to the present invention, the bit stream BS0 output from the ΔΣ modulator 1 is delayed by the shift register 2, thereby generating the bit streams BS1 and BS2 having the time difference that is one-half the PWM modulation period Tm, and the thus-generated bit streams are applied to the two-input PWM modulator 3. By such a considerably-simple configuration, aliasing noise in the audio frequency band, among the aliasing noise of quantization noise developed in the PWM modulator 3, can be sufficiently attenuated, thereby yielding an advantage of the capability of reproducing high-quality sound.

Figure 3:
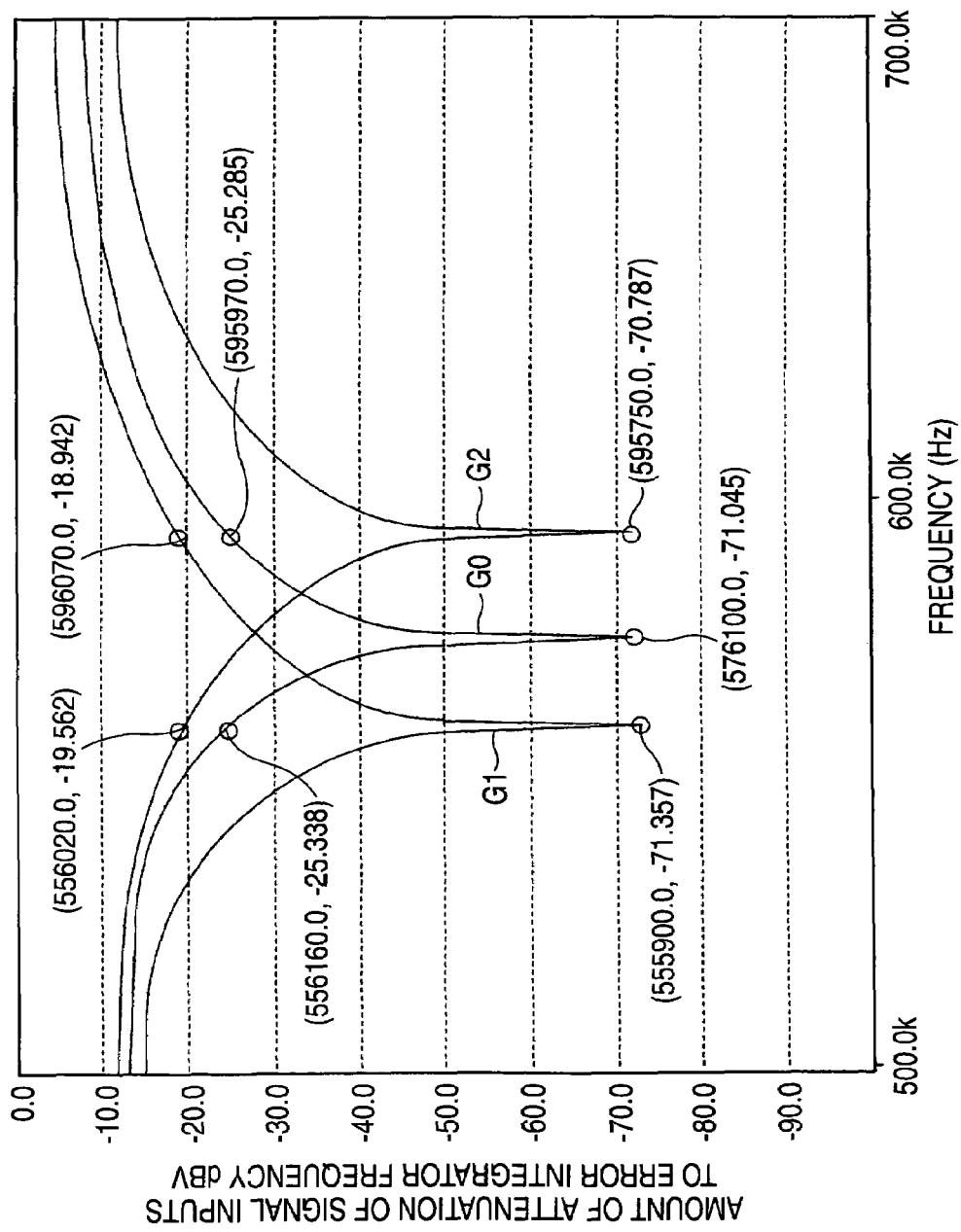
FIG. 3 is a view showing attenuation characteristics of the signals input to the error integrator acquired when a time difference between a bit stream BS1 and a bit stream BS2 is changed variously.

Although the embodiment of the present invention has been described above, other embodiments of the present invention are also conceivable as follows:

(1) In the present embodiment, the frequency of the shift clock signal φs applied to the shift register 2 is generated as a common multiple of the frequency that is two times the frequency of the bit clock signal φb and the frequency and the frequency of the PWM modulation clock signal φm, and the bit streams BS1 and BS2 having the time difference which is one-half the PWM modulation period Tm. However, an effect of attenuation of aliasing noise in the audio frequency band among the aliasing noise of quantification noise, even when the time difference between the bit stream BS1 and the bit stream BS2 do not accurately coincide with one-half the PWM modulation period Tm, so long as the time difference is close to one-half the PWM modulation period Tm to a certain extent. Accordingly, the essential requirement is to determine the frequency of the shift clock signal φs within the range where such an expected effect is achieved. The simulation performed by the present inventor shows that, when the frequency Tm of the PWM modulation clock signal φm is 576 kHz, the time difference between the bit stream BS1 and the bit stream BS2 should preferably be set to a value falling within a range of 1/[2 (Fm−20 kHz)] to 1/[2(Fm+20 kHz)]. FIG. 3 is a view showing attenuation characteristics of signals input to the error integrator of the PWM modulator 3 acquired when the time difference between the bit stream BS1 and the bit stream BS2 is changed variously. In FIG. 3, as in the case of the foregoing embodiment, a plot G0 designates an attenuation characteristic acquired when the time difference between the bit stream BS1 and the bit stream BS2 is set to Tm/2=1/(2(Fm)); a plot G1 designates an attenuation characteristic acquired when the time difference is set to ½(Fm−20 kHz)); and a plot G2 designates an attenuation characteristic acquired when the time difference is set to 1/(2(Fm+20 kHz)). When the frequency Fm of the PWM modulation clock signal φm is 576 kHz, aliasing noise in the audio frequency range, among the aliasing noise of quantization noise, is distributed within a range from 574 kHz−20 kHz to 576 kHz+20 kHz. As indicated even by the plots G0 to G2 in FIG. 3, when the time difference between the bit stream BS1 and the bit stream BS2 is set to a value falling within the range from ½{2(Fm−20 kHz)} to 1/{2(Fm+20 kHz)}, the amount of attenuation of the signals input to the error integrator exhibits a peak at a frequency within the range from 576 kHz−20 kHz to 576 kHz+20 kHz. Consequently, aliasing noise in the audio frequency band, among aliasing noise of quantization noise, can be effectively attenuated by setting the time difference between the bit stream BS1 and the bit stream BS2 to a value falling within the range from 1/{2(Fm−20 kHz)} to 1/{2(Fm+20 kHz)}.

(2) In the above embodiment, the shift register 2 is used as the delay means for delaying the bit streams BS1 and BS2. However, another delay means, such as an analogue delay line, may also be used.

(3) The class-D amplifier of the present embodiment includes the ΔΣ modulator 1. However, the present invention may also be applied to a class-D amplifier which does not include any ΔΣ modulator; which receives a ΔΣ-modulated bit stream from an external device or reproduces a ΔΣ-modulated bit stream from a recording medium; and which amplifies the bit stream.

What is claimed is:

1. A class-D amplifier comprising:
a delay unit that receives and delays an input bit stream acquired through ΔΣ modulation, and generates first and second bit streams; and
a pulse width modulator that adds the first and second bit streams, output from the delay unit, to each other, and performs a pulse width modulation processing for outputting a pulse width-modulated pulse whose pulse width is modulated according to the result of the addition;
wherein the first and second bit streams generated by the delay unit have a time difference near one-half of a period of the pulse width modulation processing.

2. The class-D amplifier according to claim 1, wherein the delay unit includes a shift register for shifting the input bit stream by a shift clock signal that is a common multiple between a frequency which is twice a frequency of the pulse width modulation processing and an output frequency of respective bits of the input bit stream, and outputs, from among signals output from respective stages of the shift register, two output signals as the first and second bit streams.

* * * * *